(12) United States Patent
Hijzen et al.

(10) Patent No.: US 8,373,236 B2
(45) Date of Patent: Feb. 12, 2013

(54) SEMICONDUCTOR DEVICE AND METHOD OF MANUFACTURING SUCH A DEVICE

(75) Inventors: Erwin Hijzen, Blanden (BE); Joost Melai, Enschede (NL); Wibo Van Noort, Wappingers Falls, NY (US); Johannes Donkers, Valkenswaard (NL); Philippe Meunier-Beillard, Kortenberg (BE); Andreas M. Piontek, Leuven (BE); Li Jen Choi, Mountain View, CA (US); Stefaan Van Huylenbroeck, Kessel-Lo (BE)

(73) Assignees: NXP, B.V., Eindhoven (NL); Interuniversitair Microelektronica Centrum VZW, Leuven (BE)

( * ) Notice: Subject to any disclaimer, the term of this patent is extended or adjusted under 35 U.S.C. 154(b) by 645 days.

(21) Appl. No.: 12/304,506

(22) PCT Filed: Jun. 12, 2007

(86) PCT No.: PCT/IB2007/052220
§ 371 (c)(1),
(2), (4) Date: Dec. 12, 2008

(87) PCT Pub. No.: WO2007/144828
PCT Pub. Date: Dec. 21, 2007

(65) Prior Publication Data
US 2009/0166753 A1 Jul. 2, 2009

(30) Foreign Application Priority Data
Jun. 14, 2006 (EP) .................................... 06115474

(51) Int. Cl.
*H01L 27/06* (2006.01)

(52) U.S. Cl. ............... 257/378; 257/351; 257/E21.532; 257/E29.174; 438/234

(58) Field of Classification Search ............... 257/378, 257/E27.011, E21.532; 438/197, 200, 234
See application file for complete search history.

(56) References Cited

U.S. PATENT DOCUMENTS

| 5,102,809 A | 4/1992 | Eklund et al. |
| 5,279,978 A | 1/1994 | See et al. |
| 6,235,567 B1 | 5/2001 | Huang |
| 6,362,066 B1 | 3/2002 | Ryum et al. |

(Continued)

FOREIGN PATENT DOCUMENTS

| EP | 0418421 A1 | 9/1989 |
| JP | 6267850 A | 3/1987 |

(Continued)

*Primary Examiner* — Minh-Loan T Tran
*Assistant Examiner* — Fazli Erdem (57) ABSTRACT

The invention relates to a semiconductor device (10) with a substrate (11) and a semiconductor body (1) comprising a bipolar transistor with in that order a collector region (2), a base region (3), and an emitter region (4), wherein the semiconductor body comprises a projecting mesa (5) comprising at least a portion of the collector region (2) and the base region (3), which mesa is surrounded by an isolation region (6). According to the invention, the semiconductor device (10) also comprises a field effect transistor with a source region, a drain region, an interposed channel region, a superimposed gate dielectric (7), and a gate region (8), which gate region (8) forms a highest part of the field effect transistor, and the height of the mesa (5) is greater than the height of the gate region (8). This device can be manufactured inexpensively and easily by a method according to the invention, and the bipolar transistor can have excellent high-frequency characteristics.

21 Claims, 6 Drawing Sheets

U.S. PATENT DOCUMENTS

| | | |
|---|---|---|
| 6,395,608 B2 | 5/2002 | Shin et al. |
| 6,555,891 B1 | 4/2003 | Furukawa |
| 6,576,507 B1 | 6/2003 | Bandy et al. |
| 6,746,928 B1 | 6/2004 | Schuegraf |
| 6,846,710 B2 | 1/2005 | Yi et al. |
| 6,927,118 B2 | 8/2005 | Idota et al. |
| 7,008,851 B2 | 3/2006 | Johansson et al. |
| 2002/0038898 A1* | 4/2002 | Sugiyama et al. ............ 257/378 |
| 2002/0190351 A1 | 12/2002 | Freeman et al. |
| 2003/0064555 A1* | 4/2003 | Ahlgren et al. ............... 438/200 |
| 2005/0133820 A1* | 6/2005 | Min et al. ....................... 257/197 |
| 2007/0224747 A1* | 9/2007 | Rochel et al. ................. 438/197 |

FOREIGN PATENT DOCUMENTS

WO    WO2005/109495    * 11/2005

* cited by examiner

SEMICONDUCTOR DEVICE AND METHOD OF MANUFACTURING SUCH A DEVICE

The invention relates to a semiconductor device with a substrate and a semiconductor body comprising a bipolar transistor with in that order a collector region, a base region, and an emitter region, wherein the semiconductor body comprises a projecting mesa within which at least a portion of the collector region and a portion of the base region are present and which is surrounded by an isolation region. Such a device, in particular when constructed as an HBT (=Heterojunction Bipolar Transistor), is highly suitable for high-frequency amplifier applications. The invention also relates to a method of manufacturing such a device.

Such a device is known from the American patent document U.S. Pat. No. 7,008,851 published on Mar. 7, 2006. A bipolar transistor is described therein comprising a mesa within which a portion of the collector region and of the base region is located. A region forming a subcollector of the transistor is furthermore present in the substrate. The mesa comprises an n-type epitaxial silicon layer forming said portion of the collector region and a p-type epitaxial layer which contains germanium and within which the base region is formed. The mesa is surrounded by an isolating layer that was formed, in that the walls of a groove (a so-termed shallow trench) surrounding the mesa are coated with an isolating layer of silicon dioxide and this groove is subsequently filled up further with an oxide.

A disadvantage of the known device is that the high-frequency characteristics thereof are in need of improvement. In addition, the manufacture of the known device is comparatively complicated.

It is accordingly an object of the present invention to provide a device of the kind mentioned in the opening paragraph which does not have the disadvantage mentioned above, or at least to a lesser degree, which is particularly fast, and which in addition is easy to manufacture.

According to the invention, a device of the kind mentioned in the opening paragraph is for this purpose characterized in that the semiconductor device further comprises a field effect transistor with a source region, a drain region, an interposed channel region, and a superimposed gate dielectric and a gate region, which gate region forms a highest part of the field effect transistor, and the height of the mesa is greater than the height of the gate region. The invention is based first of all on the recognition that the creation of a bipolar transistor with a mesa in a device that also comprises one or several field effect transistors offers major advantages, such as an inexpensive manufacture on account of the use of (C)MOS technology. The invention is furthermore based on the recognition that the high-frequency characteristics of the bipolar transistor can be improved in that the mesa of the bipolar transistor is made higher than the highest point of the field effect transistor. In order to make the bipolar transistor faster, it is desirable to use damascene-type techniques as well as sacrificial emitter regions during manufacture. This will be explained in more detail further below. The use of said damascene-type techniques implies the use of one or more CMP (=Chemical Mechanical Polishing) process steps. Since the height of the mesa is greater than that of the field effect transistor, the field effect transistor may be present already during said CMP step because the field effect transistor need not be damaged by this step in such a case. An earlier manufacture of the field effect transistor has the result that the bipolar transistor—which is not yet present at this stage—is not adversely affected by the comparatively high thermal level occasioned by especially the formation of the gate dielectric as well as the formation of the gate region of the field effect transistor. This also benefits the high-frequency characteristics of the bipolar transistor.

In a preferred embodiment, the height of the mesa is greater by at least 10% than the height of the gate region. Given such a difference in height, it is very well possible to deposit an insulating layer, such as a silicon dioxide layer, uniformly over the mesa, for example by means of CVD (=Chemical Vapor Deposition), without a subsequent CMP step for planarizing the structure causing damage to portions of the field effect transistor that are already present. Preferably, the height of the mesa is greater by at least 50% than the height of the gate region, but not greater by more than 100% than the height of the gate region. Good results are possible in this way in a CMP process without the chosen height differences leading to other disadvantages such as an uneasy formation of contacts when these are located at mutually strongly different levels.

In an important embodiment, the isolation region is covered with a conductive polycrystalline silicon region that adjoins the base region and forms a connection region thereof (denoted the extrinsic base region). This renders it possible inter alia to provide the collector, base, and emitter regions with very small, substantially equal lateral dimensions, which again benefits the high-frequency characteristics. Preferably, therefore, the emitter region is surrounded by spacers and, when viewed in projection, coincides substantially with the mesa. Viewed in projection, the conductive polycrystalline silicon region in a favorable modification shows no or no more than a slight overlap with the base region. Thus there is substantially no (parasitic) capacitance between the base connection region (or extrinsic base region) and the collector region. This improves the high-frequency characteristics. All this is possible owing to a manufacturing method according to the invention in which damascene-type techniques and a sacrificial emitter region are used.

Preferably, the isolation region comprises a further mesa which surrounds the mesa. This implies that a thick and wide isolation region can surround the mesa, with the accompanying advantage as mentioned above. In addition, the base connection region can also have comparatively large dimension as a result of this, which again contributes to the speed of the bipolar transistor.

In a favorable modification, the field effect transistor and the surface of a portion of the semiconductor body lying outside the mesa are covered with a covering layer that acts as a nucleating layer and as a protective layer. Such a layer may have, for example, a multilayer structure and comprise, for example, layers of silicon oxide and silicon nitride.

An advantageous embodiment is characterized in that a recessed semiconductor region, on which the mesa is located and which forms a portion of the collector region or the connection region thereof, is present in the semiconductor body. Such a region then constitutes a so-termed subcollector of the bipolar transistor and can have a larger surface area than the mesa itself, so that an electrical connection area of the collector region can be located at the same side of the semiconductor body as those of the base region and the emitter region.

Preferably, the device comprises field effect transistors of a first as well as of a second conductivity type opposed to the first, and the recessed semiconductor region forms part of a plurality of such recessed semiconductor regions, in a portion of which the field effect transistors of one of the two conductivity types are formed. If such a BiCMOS (=Bipolar CMOS) is formed with a p-type substrate, the NMOS transistors will be formed therein, whereas in/on the n-type recessed semiconductor regions both the PMOS transistors and an NPN bipolar transistor can be formed.

According to the invention, a method of manufacturing a semiconductor device with a substrate and a semiconductor body comprising a bipolar transistor having a collector region, a base region, and an emitter region, which semiconductor body is provided with a mesa projecting therefrom within which in that order at least a portion of the collector region and the base region are formed and which is surrounded by an isolation region, is characterized in that the semiconductor device is further provided with a field effect transistor having a source region, a drain region, an interposed channel region, a superimposed gate dielectric, and a gate region, which gate region forms a highest part of the field effect transistor, the mesa being given a height greater than the height of the gate region.

In a preferred embodiment of the method according to the invention, at least those process steps for forming the field effect transistor that determine the final height thereof are carried out before the bipolar transistor is formed. This means that the field effect transistor is not adversely affected by a CMP process as is preferably used for forming the isolation region around the bipolar transistor/mesa. Among the steps regarded as determining the height is in particular the deposition of a layer, usually containing conductive polycrystalline silicon, from which the gate region is formed. This step is necessarily preceded by the formation of an electrically insulating layer, often through thermal oxidation of silicon, from which the gate dielectric is formed. Further steps in the manufacture of the field effect transistor may be carried out in a later stage of the manufacturing process, if so desired, i.e. a stage in which the bipolar transistor has already been (substantially) fully formed. Such steps comprise a patterning of said layers and the formation of source and drain regions, and possibly a siliciding of said conductive regions. Preferably, therefore, a first layer structure is provided on the surface of the semiconductor body, which structure comprises at least a first layer from which the gate dielectric is formed and a second layer from which the gate region is formed.

In a major embodiment, the mesa is formed in that a semiconductor layer structure is provided in a single epitaxial process, said structure comprising in that order: a first semiconductor layer from which said portion of the collector region is formed and a second semiconductor layer from which the base region is formed, whereupon the mesa is formed in the semiconductor layer structure through a local provision of a mask thereon, after which a portion of the semiconductor layer structure situated outside the mask is removed by etching. The thermal load caused by the manufacture of the bipolar transistor is comparatively low as a result of this, which increases the speed of this transistor.

Preferably, the isolation region is formed by deposition of an insulating layer over the structure that results after the formation of the mesa, whereupon the structure is planarized by means of chemical mechanical polishing. In a favorable modification thereof, the isolation region is subsequently etched back down to the lower side of the base region, whereupon on the isolation region a conductive polycrystalline silicon layer is deposited by means of which a base connection region is formed. A layer structure comprising one or more sacrificial layers, out of which a sacrificial region is created during the manufacture of the mesa, is preferably formed on the semiconductor layer structure. The emitter region can be readily formed after removal of said sacrificial region.

Thus, in a favorable modification, the sacrificial layer is removed before the etching-back of the isolation region or after the deposition of the conductive polycrystalline silicon layer, and spacers are provided against the walls of the space thus created, whereupon a further conductive polycrystalline silicon layer is provided thereon in a pattern such that it forms the emitter region.

Preferably, a further mesa is formed around the mesa by means of masking and etching after the emitter region has been formed, which further mesa comprises the isolation region with the base connection region situated thereon. The isolation region can thus have comparatively large dimensions.

In an advantageous embodiment, the spacers are constructed as double spacers, and the outermost spacers are removed after the etching-back of the isolation region and before the provision of the conductive polycrystalline silicon layer. The base region and its connection region have only a small overlap as a result of this.

The invention will now be explained in more detail with reference to two embodiments and the drawing, in which.

The Figures are not drawn true to scale, the dimensions in the thickness direction being particularly exaggerated for the sake of clarity. Corresponding regions have been given the same reference numerals as much as possible, and regions of the same conductivity type are generally hatched in the same direction.

FIGS. 1 to 10 diagrammatically and in a cross-section taken perpendicularly to the thickness direction show a first example of a device according to the invention in consecutive stages of its manufacture by a method according to the invention.

Figure 1:
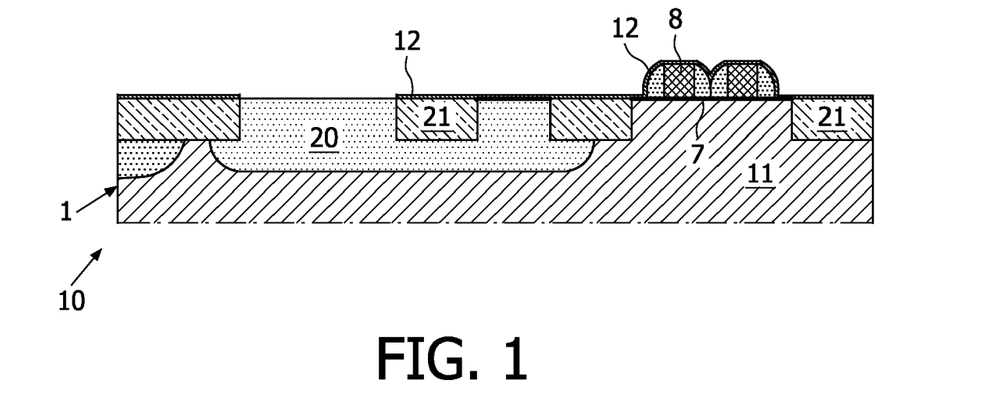
FIGS. 1 to 10 diagrammatically and in a cross-section taken perpendicularly to the thickness direction show a first example of a device according to the invention in consecutive stages of its manufacture by a method according to the invention, and FIGS. 11 and 12 diagrammatically and in a cross-section taken perpendicularly to the thickness direction show a second example of a device according to the invention in consecutive stages of its manufacture by an alternative method according to the invention.
Figure 2:
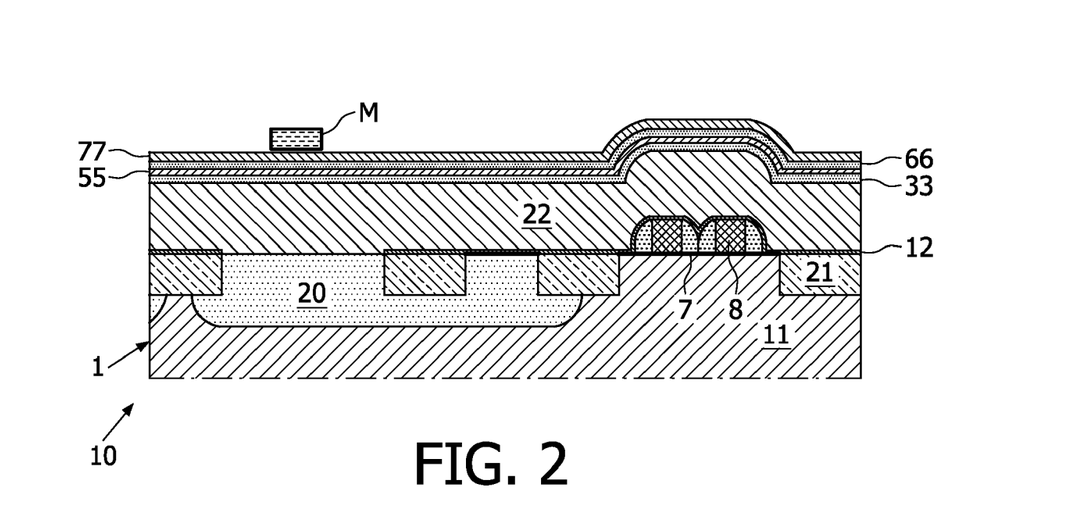
Figure 3:
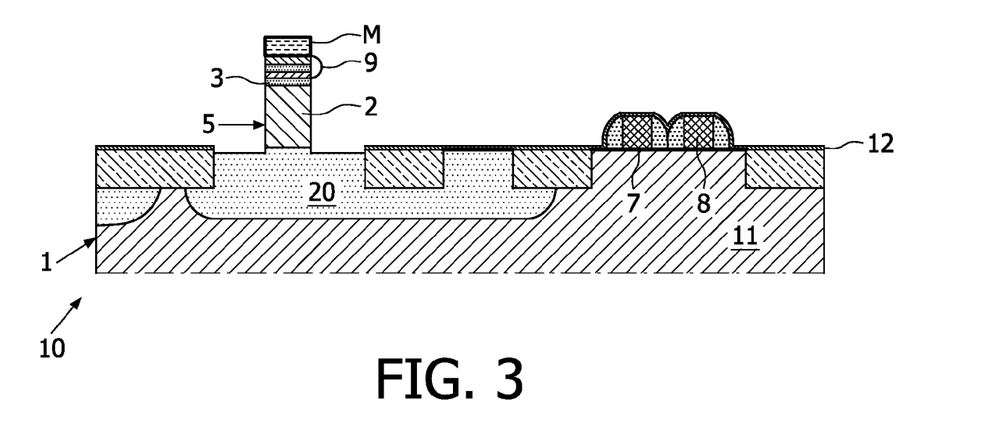
Figure 4:
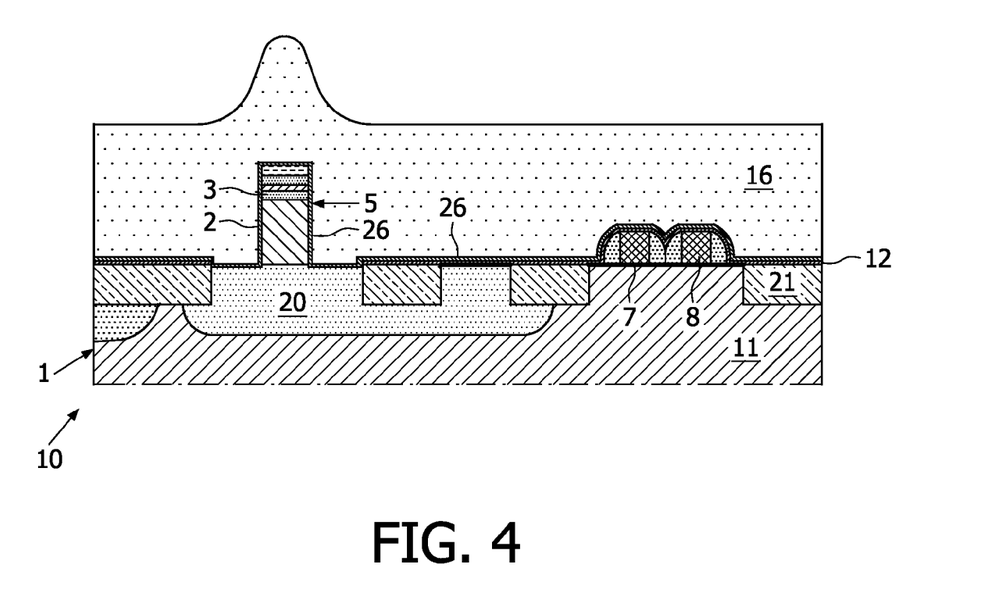
Figure 5:
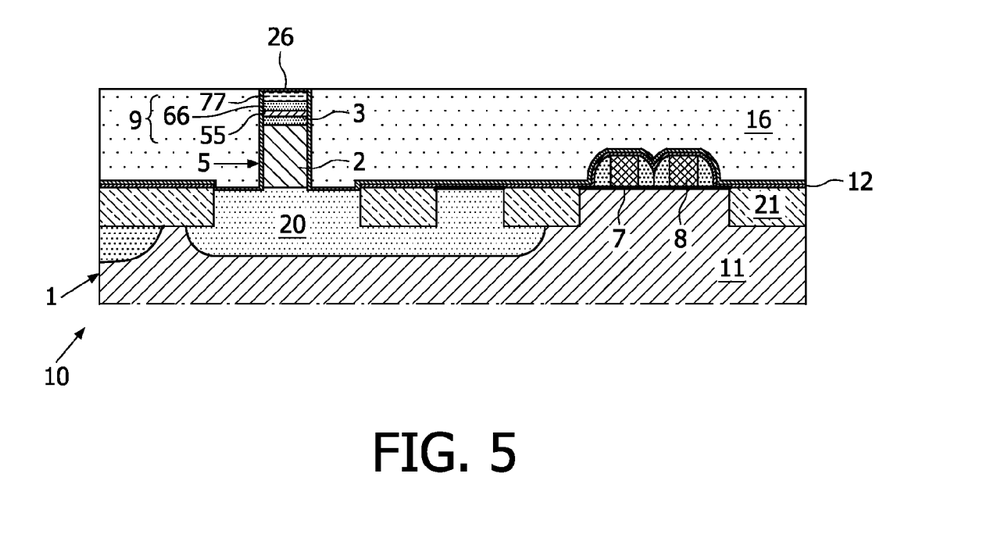
Figure 6:
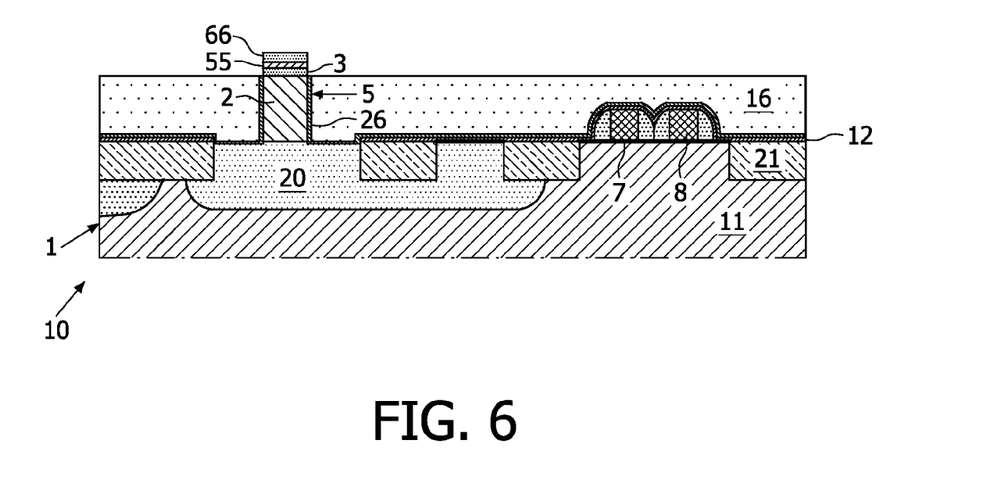
Figure 7:
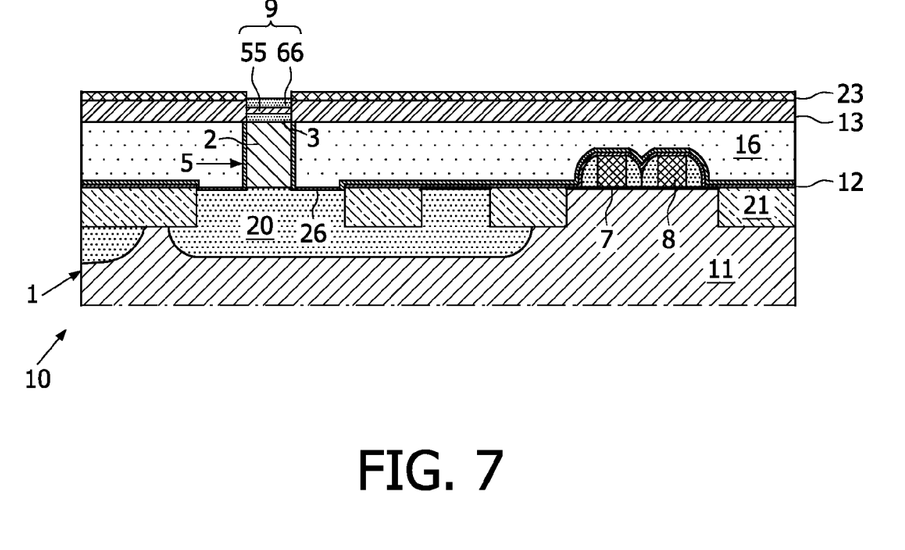
Figure 8:
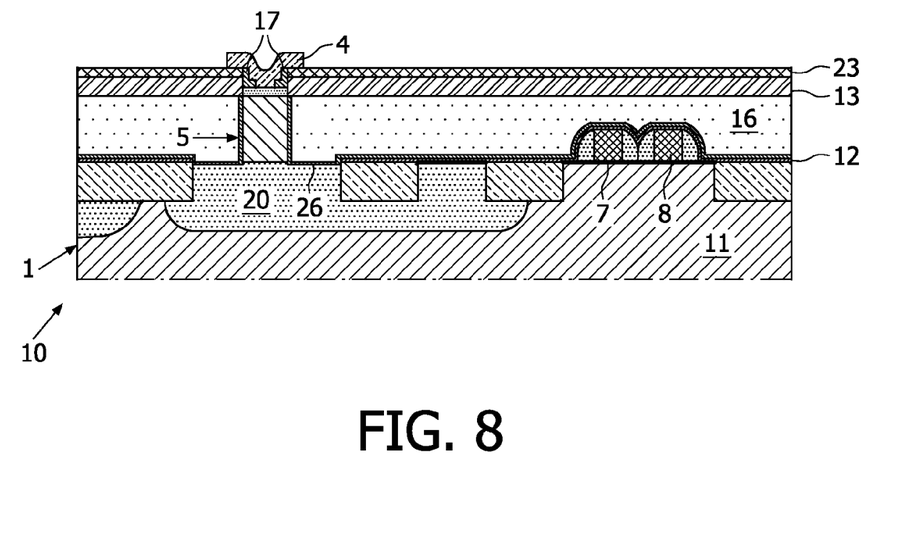
Figure 9:
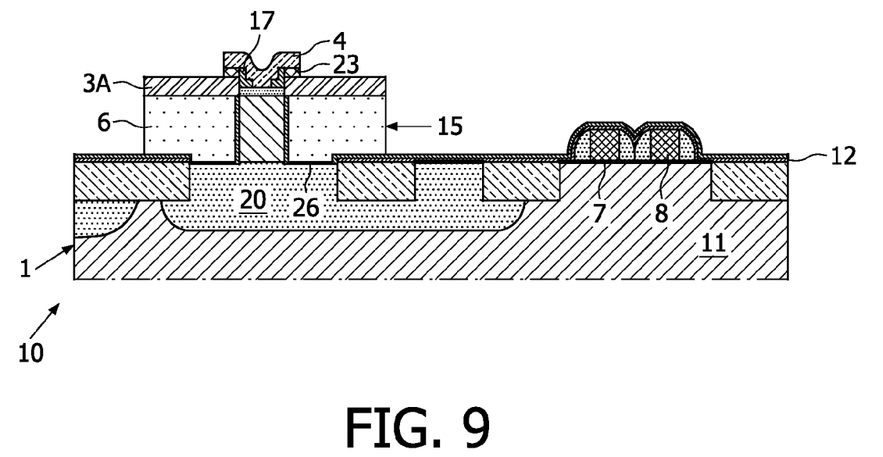
Figure 10:
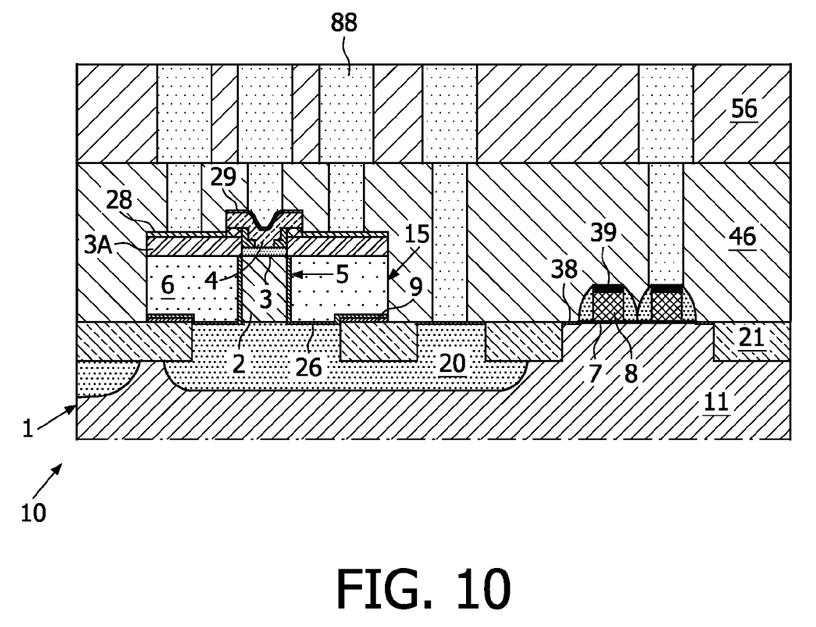

The starting point is a p-type Si substrate 11 (see FIG. 1). An epitaxial silicon layer may possibly be deposited on the substrate 11, if so desired. Then a mask (not shown), for example of photoresist, is provided, through which a recessed n-type semiconductor region 20 can be formed by means of an n-type ion implantation, such as arsenic ions. After removal of the mask, isolating regions 21 in the form of STI (Shallow Trench Isolation) are formed in a similar manner. A silicon oxide layer is subsequently provided on the—cleaned—surface of the semiconductor body 1 by means of thermal oxidation, for example at 1000° C., which layer is patterned so as to form a gate dielectric region 7. A conductive polycrystalline silicon layer is now deposited with which a gate region 8 is formed. The regions mentioned above form part of a field effect transistor that in its turn is part of the device 10. In this example the field effect transistor is completed for the major part, two such transistors, NMOS in this case, being diagrammatically depicted in the right-hand part of FIG. 1. The source region and the drain region of the left-hand and the right-hand transistor, respectively, and a common source/drain region have not been shown in the drawing. The gate regions 8 are provided with spacers on either side. A covering layer 12 is provided in a pattern over the entire structure. This layer comprises a stack of silicon oxide and silicon nitride layers here which serves not only as a nucleating layer for a subsequent epitaxial step but also as a protective layer for the previously formed MOS transistors.

Subsequently (see FIG. 2) a semiconductor layer structure is provided in a single epitaxial process, comprising in that order: an n-type silicon layer 22 and a p-type silicon-germanium layer 33. The conductivity type and composition are adapted in a simple manner through a change in the composition of the gas conducted through the epitaxy reactor. A sacrificial layer structure comprising in that order a silicon (di)oxide layer 55, a silicon nitride layer 66, and a silicon (di)oxide layer 77s then provided on the semiconductor layer structure by means of CVD. A mask M, of photoresist in this case, is provided in a pattern on top of this.

Subsequently (see FIG. 3) a mesa 5 is formed in the (semi-conductor) layer structure by means of etching, for example RIE (Reactive Ion Etching) or some other dry etching process, whereby a collector region 2 with a base region 3 thereon of a bipolar transistor to be created is formed. A sacrificial region 9 comprising portions of the layers 55, 66, 77 is present on the base region 3. Etching is continued down to the silicon surface of the recessed region 20 and down to the covering layer 12.

Then (see FIG. 4) the mask M is removed and an electrically insulating layer 16, of HDP (High Density Plasma) silicon dioxide in this case, is deposited over the structure. This deposition is preceded in the present example by a deposition, by CVD in this case, of a thin layer 26 of silicon nitride. This layer can serve as an etch stopper.

Subsequently (see FIG. 5) the resulting structure is planarized by means of CMP.

Then (see FIG. 6) the insulating layer 16 is etched back on either side of the mesa 5 down to approximately (the lower side of) the base region 3. The exposed portion of the thin isolating layer 26 is then removed by etching, as is the upper portion 77 (comprising oxide) of the sacrificial region 9.

Subsequently (see FIG. 7) a conductive polycrystalline silicon layer 13, of the p-type in this case, is deposited, whereupon the resulting structure is planarized by CMP. The upper side of the silicon layer 13 is then converted into an isolating region 23 of silicon dioxide by means of wet thermal oxidation.

After this (see FIG. 8) the remaining portion of the sacrificial region 9 is removed in a few (selective) etching steps. This provides the structure with a cavity, in which spacers 17 are formed, of silicon nitride in this case, through deposition of a uniform layer followed by the removal of the horizontal portions thereof through anisotropic etching. A polycrystalline silicon layer 4 is then deposited and patterned, said layer forming an epitaxial/monocrystalline emitter region 4 of the bipolar transistor in the cavity between the spacers 17.

Subsequently (see FIG. 9), with the emitter region 4 serving as a mask, the isolating region 23 is removed outside the emitter region 4 by means of etching, whereby the base connection region 3A is exposed. A further mesa 15 is then formed around the mesa 5 by means of etching with a mask (not shown), for example made of photoresist, thus forming from the isolating layer 16 the isolation region 6 which surrounds the bipolar transistor.

Then (see FIG. 10) the portion of the covering layer 12 exposed during the formation of the further mesa 15 is removed by etching, whereupon both the emitter region 4 and the base connection region 3A are provided with respective silicide regions 28, 29, such as of nickel or cobalt silicide. The source and drain regions and the gate region of the field effect transistor(s) may be provided with metal silicide regions 38, 39 at the same time. After further isolating layers 46, 56 have been provided and have been given suitable openings by means of photolithography, electrical connections 88 are provided therein with which both the bipolar transistor and the field effect transistor can be electrically connected.

Figure 11:
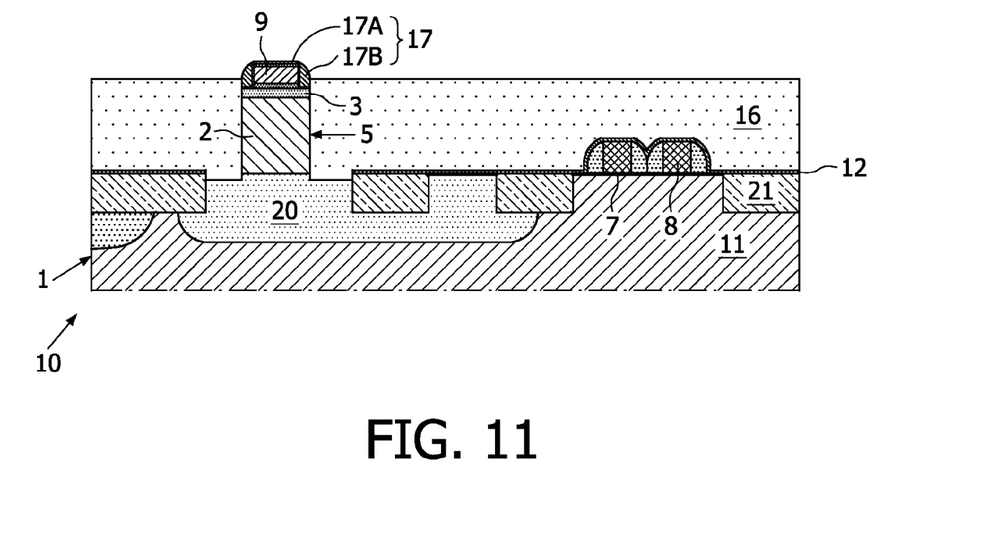
Figure 12:
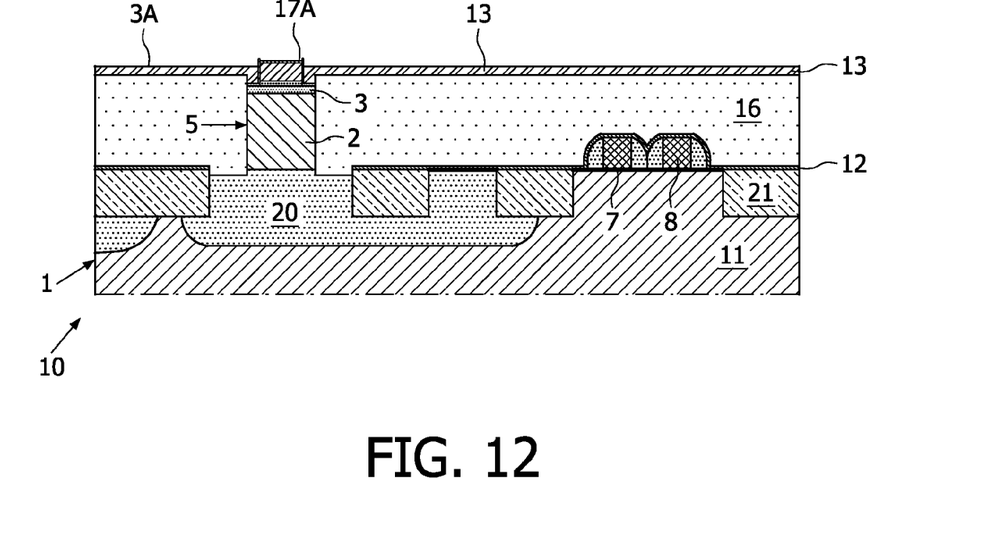

FIGS. 11 and 12 diagrammatically and in a cross-section taken perpendicularly to the thickness direction show a second example of a device according to the invention in consecutive relevant stages of its manufacture by a modified method according to the invention.

FIG. 11 shows how dual spacers 17 are formed on either side of a sacrificial region 9, for example spacers 17A of silicon nitride and spacers 17B of silicon oxide. This takes place, for example, in a manufacturing stage corresponding to FIG. 2. The mask is first used for etching the sacrificial layers in that case, the etching being stopped upon reaching the semiconductor layer structure. Then the spacers 17A, 17B are formed in that order in the same manner, whereupon etching of the mesa 5 is continued in the semiconductor layer structure. The mask in this case may be chosen to be slightly smaller than in the first example. The mesa 5 thus formed can nevertheless have the same lateral dimensions then as in the first example.

Before the polycrystalline silicon layer 13 (see FIG. 12) is deposited for forming the base connection region 3A, the outermost spacers 17B are now removed by (selective) etching. As a result of this the polycrystalline silicon layer 13 has a slight overlap with the base region 3, so that on the one hand a low resistance of the extrinsic base (connection) region 3A is made possible, while on the other hand it can be avoided that the isolating layer 16 reaches too low a level in being etched back, which would create a parasitic capacitance between the collector region 2 and the base connection region 3A with adverse consequences for the speed of the bipolar transistor.

An alternative to this second example may be offered in that an etch stopper layer, for example of silicon nitride, is formed at the desired level in the isolating layer 16 of silicon dioxide. This may be realized by means of an ion implantation of nitrogen ions with a suitably chosen implantation energy. To protect the base region 3 (and the collector region 2) against this implantation, the mesa 5 may be provided with a mask. A self-registering formation of this mask may be achieved, for example, in that an exposed, electrically conducting portion of the sacrificial region 9 is electrochemically provided with a metal layer of a desired thickness. Such a portion of the sacrificial region 9, for example of polycrystalline silicon, may first be provided with a conductive metal silicide in a self-registering manner, if so desired, before the electrochemical growing process for forming said mask is carried out.

The invention is not limited to the embodiments given, many modifications and variations being possible to those skilled in the art within the scope of the invention. Thus thicknesses, (semi)conductor materials, or compositions other than those mentioned in the examples may be used. Also, all conductivity types used may be simultaneously replaced by their opposites. Various process steps not material to the invention may be carried out in an alternative manner; thus an oxide layer obtained through plasma deposition may alternatively be formed by deposition from the gas phase.

It is further noted that, instead of a bipolar transistor of which the emitter region is located at the upper side, a reversed structure may alternatively be used. The collector region would then be at the upper side of the mesa and the emitter region at the lower side thereof.

It is finally noted that the use of the device and the method according to the invention is not limited to ICs (Integrated Circuits) but may equally well be applied to (semi) discrete devices. Furthermore, other (semiconductor) components may be integrated into the semiconductor body.

The invention claimed is:

1. A semiconductor device comprising:
a substrate including a bottom surface; and
a semiconductor body including:
a bipolar transistor with in that order a collector region, a base region, and an emitter region, wherein at least a portion of the collector region and a portion of the base region form a mesa projecting from a surface of the substrate, wherein an isolation region is laterally disposed around at least a portion of the mesa, wherein the collector region and the base region have substantially equal lateral dimensions, and
a field effect transistor with a source region, a drain region, an interposed channel region, a superimposed gate dielectric, and a gate region, which gate region forms a highest part of the field effect transistor, and the height at a highest part of the mesa is higher than the highest part of the field effect transistor relative to the bottom surface of the substrate.

2. A semiconductor device as claimed in claim 1, characterized in that the height at a highest part of the mesa is higher by at least 10% than the highest part of the field effect transistor relative to the bottom surface of the substrate.

3. A semiconductor device as claimed in claim 1, characterized in that the height at a highest part of the mesa is higher by at least 50% than the highest part of the field effect transistor, but not higher by more than 100% than the highest part of the field effect transistor relative to the bottom surface of the substrate.

4. A semiconductor device as claimed in claim 1, characterized in that the upper side of the isolation region is covered with a conductive region, preferably comprising polycrystalline silicon, which adjoins the base region and forms a connection region thereof.

5. A semiconductor device as claimed in claim 4, characterized in that the emitter region is surrounded by spacers and, when viewed in projection, coincides substantially with the mesa.

6. A semiconductor device as claimed in claim 4, characterized in that, when viewed in projection, the conductive polycrystalline silicon region has no more than a slight overlap with the base region.

7. A semiconductor device as claimed in claim 1, characterized in that the isolation region forms a further mesa which surrounds the mesa.

8. A semiconductor device as claimed in claim 1, characterized in that the field effect transistor and the surface of a portion of the semiconductor body lying outside the mesa are covered with a covering layer that acts as a nucleating layer and as a protective layer.

9. A semiconductor device as claimed in claim 4, characterized in that a recessed semiconductor region, on which the mesa is located and which forms a portion of the collector region or the connection region thereof, is present in the semiconductor body.

10. A semiconductor device as claimed in claim 9, characterized in that the device comprises field effect transistors of a first as well as of a second conductivity type opposed to the first, and the recessed semiconductor region forms part of a plurality of such recessed semiconductor regions, in a portion of which the field effect transistors of one of the two conductivity types are formed.

11. A semiconductor device as claimed in claim 1, characterized in that the bipolar transistor comprises a heterojunction bipolar transistor.

12. A method of manufacturing a semiconductor device with a substrate including a bottom surface and a semiconductor body comprising a bipolar transistor with in that order a collector region, a base region, and an emitter region, wherein at least a portion of the collector region and the base region form a mesa projecting from a surface of the substrate, and wherein an isolation region is laterally disposed around at least a portion of the mesa, wherein the collector region and the base region have substantially equal lateral dimensions, characterized in that the semiconductor device is further provided with a field effect transistor having a source region, a drain region, an interposed channel region, a superimposed gate dielectric, and a gate region, which gate region forms a highest part of the field effect transistor, the mesa being given a height at a highest part of the mesa that is chosen to be higher than the height given to the highest part of the field effect transistor relative to the bottom surface of the substrate.

13. A method as claimed in claim 12, characterized in that at least those process steps for forming the field effect transistor that determine the final height thereof are carried out before the bipolar transistor is formed.

14. A method as claimed in claim 13, characterized in that a first layer structure is provided on the surface of the semiconductor body, which structure comprises at least a first layer from which the gate dielectric is formed and a second layer from which the gate region is formed.

15. The method as claimed in claim 12 characterized in that the mesa is formed in that a semiconductor layer structure is provided in a single epitaxial process, said structure comprising in that order a first semiconductor layer from which said portion of the collector region is formed and a second semiconductor layer from which the base region is formed, whereupon the mesa is formed in the semiconductor layer structure through a local provision of a mask thereon, after which a portion of the semiconductor layer structure situated outside the mask is removed by etching.

16. The method as claimed in claim 12, characterized in that the isolation region is formed by deposition of an isolating layer over the structure that results after the formation of the mesa, whereupon the structure is planarized by means of chemical-mechanical polishing.

17. A method as claimed in claim 16, characterized in that the isolation region is etched back down to a level corresponding with the lower side of the base region, whereupon on the etched back isolation region a conductive polycrystalline silicon layer is deposited by means of which a base connection region is formed.

18. A method as claimed in claim 15, characterized in that a layer structure comprising one or more sacrificial layers, out of which a sacrificial region created during the manufacture of the mesa, is provided on the semiconductor layer structure.

19. A method as claimed in claim 18, characterized in that the sacrificial layer is removed before the etching-back of the isolation region or after the deposition of the conductive polycrystalline silicon layer, and spacers are provided against the walls of the space thus created, whereupon a further conductive polycrystalline silicon layer is provided thereon in a pattern such that it forms the emitter region.

20. A method as claimed in claim 19, characterized in that a further mesa is formed around the mesa by means of masking and etching after the emitter region has been formed, which further mesa comprises the isolation region with the base connection region situated thereon.

21. A method as claimed in claim 19, characterized in that the spacers are constructed as double spacers, and the outermost spacers are removed after the etching-back of the isolation region and before the provision of the conductive polycrystalline silicon layer.

* * * * *